(12) United States Patent
Wohlfeil

(10) Patent No.: US 10,031,290 B2
(45) Date of Patent: Jul. 24, 2018

(54) OPTICAL INTERFERENCE FILTER DEVICE, ESPECIALLY FOR AN OPTICAL WAVELENGTH LOCKING DEVICE

(71) Applicant: ADVA Optical Networking SE, Meiningen (DE)

(72) Inventor: Benjamin Wohlfeil, Erfurt (DE)

(73) Assignee: ADVA Optical Networking SE, Meiningen (DE)

(*) Notice: Subject to any disclaimer, the term of this patent is extended or adjusted under 35 U.S.C. 154(b) by 0 days.

(21) Appl. No.: 15/788,388

(22) Filed: Oct. 19, 2017

(65) Prior Publication Data

US 2018/0136400 A1 May 17, 2018

(30) Foreign Application Priority Data

Nov. 14, 2016 (EP) ..................... 16198701

(51) Int. Cl.
| G02B 6/12 | (2006.01) |
| H04J 14/02 | (2006.01) |
| H04B 10/12 | (2006.01) |
| G02B 6/293 | (2006.01) |
| G02B 6/42 | (2006.01) |
| H04B 10/572 | (2013.01) |
| H01S 3/08 | (2006.01) |
| H01S 5/14 | (2006.01) |

(52) U.S. Cl.
CPC ..... *G02B 6/29338* (2013.01); *G02B 6/29343* (2013.01); *G02B 6/4215* (2013.01); *H01S 3/08027* (2013.01); *H01S 5/141* (2013.01); *H04B 10/572* (2013.01); *G02B 6/29344* (2013.01); *G02B 6/29389* (2013.01)

(58) Field of Classification Search
CPC .............. G02B 6/4215; G02B 6/29338; G02B 6/29343; G02B 6/29389; H04B 10/572; G02F 1/011; H01S 3/08027; H01S 5/141
USPC ...... 385/1–3, 9, 14, 30, 32; 398/93, 95, 195, 398/196
See application file for complete search history.

(56) References Cited

U.S. PATENT DOCUMENTS

| 6,353,623 | B1 | 3/2002 | Munks et al. |
| 6,782,017 | B1 | 8/2004 | Kai et al. |
| 7,738,527 | B2 * | 6/2010 | He .......................... H01S 5/026 372/108 |
| 8,111,994 | B2 | 2/2012 | Popovic |
| 8,532,441 | B2 * | 9/2013 | Rasras ............. B29D 11/00663 372/20 |
| 9,166,695 | B2 | 10/2015 | Eiselt et al. |

(Continued)

FOREIGN PATENT DOCUMENTS

| CA | 2278358 A1 | 6/2000 |
| DE | 10219244 A1 | 11/2003 |

(Continued)

*Primary Examiner* — Robert Tavlykaev
(74) *Attorney, Agent, or Firm* — The Webb Law Firm

(57) ABSTRACT

The invention relates to an optical interference filter device which defines a first periodic filter frequency response between a first filter output port and a filter input port and a second periodic filter frequency response having the same free spectral range as the first periodic frequency response between a second filter output port and the filter input port. The first and second periodic filter frequency responses are shifted versus each other by a predetermined optical frequency distance.

17 Claims, 5 Drawing Sheets

(56) References Cited

U.S. PATENT DOCUMENTS

| | | | |
|---|---|---|---|
| 9,395,487 B2* | 7/2016 | Uesaka | G01J 9/0246 |
| 9,835,881 B2* | 12/2017 | Guzzon | G02F 1/0121 |
| 2006/0050355 A1* | 3/2006 | Godfreid | G01J 3/26 |
| | | | 359/260 |
| 2009/0086774 A1* | 4/2009 | Suzuki | H04J 14/02 |
| | | | 372/20 |
| 2010/0086261 A1 | 4/2010 | Tanaka | |
| 2013/0089324 A1* | 4/2013 | Eiselt | H04B 10/40 |
| | | | 398/34 |
| 2013/0195446 A1* | 8/2013 | Zheng | H04B 10/506 |
| | | | 398/34 |
| 2014/0185045 A1 | 7/2014 | Han et al. | |
| 2015/0277053 A1* | 10/2015 | Zheng | G02B 6/29341 |
| | | | 385/31 |
| 2016/0116655 A1 | 4/2016 | Du | |
| 2017/0353001 A1* | 12/2017 | Takabayashi | H01S 3/1003 |

FOREIGN PATENT DOCUMENTS

| | | |
|---|---|---|
| EP | 2573961 A1 | 3/2013 |
| WO | 2008021467 A2 | 2/2008 |

* cited by examiner

OPTICAL INTERFERENCE FILTER DEVICE, ESPECIALLY FOR AN OPTICAL WAVELENGTH LOCKING DEVICE

CROSS-REFERENCE TO RELATED APPLICATION

This application claims priority to European Patent Application No. 16198701.1 filed Nov. 14, 2016, the disclosure of which is hereby incorporated in its entirety by reference.

BACKGROUND OF THE INVENTION

Field of the Invention

The invention relates to an optical interference filter device, especially for an optical wavelength locker. Further, the invention relates to an optical transmitter or transceiver device including an optical wavelength locker comprising a respective optical interference filter device.

Description of Related Art

Detecting changes in the emission wavelength of tunable lasers and providing a feedback signal for the accurate adjustment of the emission wavelength is a decisive task in optical wavelength division multiplex transmission (WDM) systems, especially dense wavelength division multiplex transmission (DWDM) systems.

Components serving this purpose are readily available on the market. Usually a Fabry-Pérot etalon is used having a periodic optical frequency response with a fixed free spectral range (FSR) corresponding to the frequency channel grid of the (D)WDM system. The etalon is coupled to the tunable laser in such a way that a predetermined small fraction of the optical power of the modulated or unmodulated signal created by the laser is guided through the etalon. The etalon maps changes in the laser emission wavelength to intensity changes in the light that has passed through the etalon and that is detected by a photodetector, for example by a photodiode. The magnitude of changes in the photocurrent as well as the algebraic sign thereof are used to adjust or readjust the laser wavelength. Of course, a feedback control may be applied in order to continuously or quasi-continuously (i.e. in predetermined, preferably equidistant time intervals) adjust the actual laser wavelength. In order to achieve a sufficient sensitivity with respect to the changes of the feedback signal, it is desirable to design the periodic frequency response in such a way that it reveals a sufficiently high positive or negative slope at the desired center wavelength of the tunable laser to be controlled. Thus, if an etalon having the same FSR as the channel grid of the (D)WDM is used, the optical frequency response of the etalon, especially the optical power transmission spectrum thereof, is shifted versus the optical power transmission spectrum defining the respective optical channel.

The reflective index and the thickness of the materials used in the optical path of the Fabry-Pérot etalon determine the FSR of this device. Both parameters are set to emulate a fixed frequency grid, having, for example, an FSR of 25 GHz, 50 GHz or 100 GHz as defined in ITU-T G.649.1. The materials used for the etalon are chosen in such a way that they exhibit a very low dependence of their physical properties on environmental conditions, so that changes in environmental conditions, especially temperature changes, do not affect the etalon's optical transmission characteristics.

It is also known to use a periodic optical filter, especially realized by one or more etalons, in a central wavelength locking device, which is configured to receive a plurality of optical channel signals, for example an optical WDM signal, and to create, for each of the optical signals received, a feedback signal corresponding to the actual optical center wavelength (EP 2 573 961 A1). Each of the feedback signals (the value and the sign thereof) can be used to control the actual optical center wavelength of the respective optical channel signal in such a way that the desired center wavelength is reached with sufficient accuracy.

It is further known from EP 2 573 961 A1 to design a central wave locking device in such a way that two etalons or periodic optical filters are used for creating a feedback signal for each of the optical channel signals received, wherein the periodic frequency responses of the two etalons reveal essentially the same FSR but are shifted versus each other, for example by a quarter of the FSR, in order to obtain a sufficient or optimal sensitivity of the feedback signal with respect to changes of the actual wavelength or optical frequency of the channel signals to be monitored, especially within an adjustment or control range that comprises the desired optical center wavelength or optical center frequency.

This design of a wavelength locking device reveals a sufficient sensitivity of the feedback signal with respect to changes in the actual center wavelength of a channel signal over the whole desired range, for example the total bandwidth covered by a WDM transmission system. Thus, such an optical wavelength locking device may be referred to as wavelength-agnostic and channel-spacing-agnostic.

The disadvantage of an optical wavelength locking device using one or more etalons is the use of free space paths within the optical paths of a conventional etalon and problems related therewith. Especially, it is impossible or requires considerable effort to develop an integrated design of an etalon and the free space optics must be shielded against environmental influences like humidity and dust.

US 2010/0086261 A1 discloses an optical module which comprises an integrated wavelength locking device. An optical ring resonator is realized using planar optical waveguides, e.g. on a silicon on insulator (SOI) substrate. A semiconductor laser, a semiconductor Mach-Zehnder modulator and a photodiode are being mounted onto the substrate. The laser output is connected to an input port and the photodiode is connected to the pass-through port of the ring resonator. The interferometer is connected to the drop port of the ring resonator. Thus, the photodiode detects the optical wavelength portions of the optical signal created by the laser which are not output at the drop port.

The disadvantage of this wavelength locking device is, however, that the ring resonator must be designed in such a way that the desired center wavelength corresponds to a maximum of the periodic frequency response between the drop port and the input port of the resonator in order to keep the attenuation at a minimum. The laser may be controlled so that the electrical signal output by the photodiode is at a minimum. Thus, the sensitivity depends on the form of the laser spectrum and is generally low. If the spectrum reveals no components outside a bandwidth that is smaller than the filter bandwidth of the respective filter peak of the frequency response, the characteristic curve of the electrical signal output by the photodiode depending on a wavelength shift of the laser signal is essentially flat. Thus, exactly controlling the laser signal so that its center wavelength lies in the center of the respective filter peak of the ring resonator frequency response is impossible or requires additional effort.

SUMMARY OF THE INVENTION

It is thus an object of the present invention to provide an optical interference filter device, especially for an optical wavelength locking device, which does not use free space paths, which can be manufactured in integrated optics and which provides two periodic (power) frequency responses that are shifted versus each other by a predetermined wavelength or optical frequency distance. Further, it is an object of the invention to provide an optical transmitter or transceiver device comprising such an optical interference filter device.

The invention starts from the finding that a wavelength-agnostic and channel spacing-agnostic wavelength locking device can be provided by using an optical interference filter device which defines a first periodic filter frequency response between a first filter output port and a filter input port and a second periodic filter frequency response having the same FSR as the first periodic frequency response between a second filter output port and the filter input port, wherein the first and second periodic filter frequency responses are shifted versus each other by a predetermined optical frequency distance, preferably by a quarter of the FSR.

It shall be noted at this point that the term "frequency response", which generally comprises both a real and an imaginary part or a magnitude and a phase part, is used throughout this description synonymously with its magnitude as long as it is not apparent to an expert that both the magnitude and the phase parts of the frequency response play a role in the respective context. Especially, the requirement of a periodic frequency response means that the magnitude of the frequency response is periodic whereas the phase may not be periodic.

The optical interference filter device according to the invention comprises an optical ring resonator structure and an optical combining and phase shifting structure. The optical ring resonator comprises two optically coupled ring-shaped optical waveguides, each of which is further coupled to a dedicated optical port waveguide, wherein one of the optical port waveguides defines the filter input port at a first end thereof and first resonator output port at a second end thereof and wherein the other of the optical waveguides has an open first end and defines a second resonator output port at a second end thereof. The optical combining and phase shifting structure has a first and second input port and a first and second output port. The first input port is connected to the first resonator output port and the second input port is connected to the second resonator output port, wherein the first and second output ports define the first and second filter output ports, respectively. The optical combining and phase shifting structure comprises a first crossover path between the first input port and the second output port, a second crossover path between the second input port and the first output port, a first pass-through path between the first input port and the first output port and a second pass-through path between the second input port and the second output port, wherein in both crossover paths and/or both pass-through paths optical phase shifting means are provided which are configured to effect a phase shift difference of plus or minus 90 degrees between the optical signals that are guided in the first pass-through path and the second crossover path a phase shift difference of plus or minus 90 degrees between the optical signals that are guided in the second pass-through path and the first crossover path.

As a result, the optical combining and phase shifting structure correspondingly multiplexes the optical signals, which are received at the first input port (this signal is output at the first resonator output port) and at the second input port (this signal is output at the second resonator output port), in such a way that either the signals in the pass-through paths or the signals in the crossover paths are phase-shifted by 90 degrees. The multiplexed (and phase shifted) signals are output at the first and second output ports, which define the first and second filter output ports.

According to an embodiment of the invention, the optical ring resonator structure is designed in such a way that it defines a periodic frequency response between the first resonator structure output port and the filter input port and a complementary periodic frequency response between the second resonator structure output port and the filter input port, the periodic frequency response comprising two superimposed partial periodic frequency responses, which are shifted versus each other by a predetermined optical frequency distance equal to the frequency shift between the first and second periodic filter frequency responses and which have a free spectral range equal to the free spectral range of the first and second periodic filter frequency responses.

The multiplexing function that is carried out by the optical combining and phase shifting structure is similar, in the frequency domain, to a separation of the partial frequency responses at the filter output ports.

The phase shift between the first and second partial periodic frequency responses (and thus between the first and second filter frequency responses) may be set to a frequency (or wavelength) distance corresponding to a quarter of the FSR. This phase shift leads to a sufficient sensitivity of the optical power measured either at the first or at the second filter output ports depending on the center wavelength of an optical input signal. In an alternative, as described in EP 2 573 961 A1, the ratio of the optical powers measured at the first and second filter output port may be used in order to create a feedback signal for controlling the center wavelength of the respective optical signal that is supplied to the input port of the filter device. Also in this alternative, the frequency shift between the partial frequency responses leads to a sufficient sensitivity of this ratio depending on changes of the center frequency of the optical filter input signal.

Thus, the frequency shift (i.e. the frequency distance) between the first and second filter frequency responses can be set by appropriately designing the ring-shaped optical waveguides, especially the geometry, the materials thereof, and the coupling factors between the first and second ring-shaped optical waveguides. That is, in order to obtain a desired frequency between the first and second periodic filter frequency responses, a respective frequency shift between the first and second partial periodic frequency responses must be obtained by appropriately designing the ring-shaped optical waveguides.

According to a further embodiment, one or both of the optical port waveguides may comprise an essentially straight coupling section, which is configured to effect the optical coupling with the respective ring-shaped optical waveguide. Of course, the whole optical port waveguides may be straight.

Further, one or both of the ring-shaped optical waveguides may comprise a straight coupling section, which is configured to effect the optical coupling with the respective optical port waveguide.

One or both of the ring-shaped optical waveguides may comprise a straight coupling section, which is configured to effect the optical coupling with the respective other ring-shaped waveguide.

Generally, a straight coupling section, especially the combination of two straight coupling sections, simplify the design of the coupling areas (i.e. the geometry and materials of the coupling sections including the distance thereof) in such a way that desired coupling factors (or a desired coupling behavior) are achieved.

According to a further embodiment, the optical combining and phase shifting structure comprises, at each of the first and second input ports, an optical splitter for splitting the optical path into the respective pass-through and crossover paths, at each of the first and second output ports, an optical combiner for combining the respective pass-through and crossover paths, and, either within both pass-through paths or within both crossover paths, an optical 90 degrees phase shifter. The optical splitters and combiners may, for example, be wavelength-independent 50:50 1×2 splitters. Such splitters may be realized as MMI or evanescent splitters.

According to an embodiment of the invention, the optical combining and phase shifting structure may be realized as an optical 2×2 (MMI) multimode interference coupler. Such an optical coupler may be designed in such a way that it inherently realizes the splitting and combining of the optical paths and the required 90 degrees phase shift. Such a 2×2 MMI coupler reveals, between a first input and a first output port and between a second input and a second output port, respective optical pass-through paths and between the first input and the second output port and between the second input and the first output port, respective optical crossover paths.

Also, the optical coupling between the two ring-shaped optical waveguides and/or the optical coupling between the optical port waveguides and the respective ring-shaped optical waveguides may be effected by using evanescent coupling or by multimode interference coupling.

According to a further embodiment of the invention, the optical interference filter device comprises a temperature control device for stabilizing the temperature of the two ring-shaped optical waveguides at a predetermined temperature. In this way, the course of the frequency responses of the optical ring resonator structure and thus the course of the frequency responses of the whole optical interference filter device (especially the FSR of first and second periodic frequency responses) can be kept constant.

The temperature control device may comprise at least one temperature sensor, which is configured to create a sensor signal depending on the temperature of the ring resonator structure, especially the temperature of the two ring-shaped optical waveguides, a cooling and/or heating device and a control unit, which is configured to receive the sensor signal of the at least one temperature sensor and to create a control signal, which is supplied to the cooling and/or heating device, in such a way that the at least one sensor signal is controlled to a predetermined value that corresponds to the predetermined temperature.

According to a preferred embodiment, the temperature control device comprises a heating device, which is configured to stabilize the temperature of the ring resonator structure, especially the temperature of the two ring-shaped optical waveguides, at a value that is higher than any environmental temperature to be expected, preferably at a value at the upper limit of a specification range for the environmental temperature that has been specified for the optical interference filter device. In this way, a more complex and expensive device, which allows for heating and cooling of the ring resonator structure, can be avoided.

Of course, the temperature control device may be configured to not only stabilize the temperature of the ring resonator structure but also the temperature of the optical combining and phase shifting structure.

According to an embodiment of the invention, the optical interference filter device may be manufactured using a technique for integrated optics, i.e. integrating the optical ring resonator structure and, as the case may be, also the optical combining and phase shifting structure, in a single optical component. In this way, the optical ring resonator structure and, optionally, the optical combining and phase shifting structure can be realized on a substrate, for example an insulator substrate like a silicon on insulator (SOI) substrate. In this way, the optical interference filter device according to the invention can be manufactured at low cost.

An optical transmitter or transceiver device according to the invention comprises at least one tunable laser and an optical interference filter device according to one of the embodiments described above. The at least one tunable laser and the optical interference filter device may be provided on a common substrate, wherein at least one laser and the optical interference filter device are provided on separate substrates, which are mounted on the common substrate. As an alternative, the at least one laser and the optical interference filter device may be directly manufactured on the common substrate. As a further alternative, the at least one laser may be manufactured on a separate substrate (for example as a laser chip) which is mounted on the substrate of the optical interference filter device (i.e. the optical interference filter device is an integrated optics component configured to receive the at least one tunable laser, which is a laser chip).

It is of course also possible to provide two optical receiving elements on the abovementioned common substrate or on the substrate of the optical interference filter device, wherein the input ports of the optical receiving elements (for example photodiodes configured to detect the optical power of a signal received) are connected to the filter output ports of the optical interference filter device.

The optical transmitter or transceiver device may be designed in such a way that an output port of the at least one laser is directly or indirectly (i.e. via one or more intermediate optical components, like further splitters, an optical isolator etc.) coupled to an input port of an optical splitter and that the filter input port of the optical interference filter device is coupled to an output port of the optical splitter. That is, a predefined small portion (for example 1 to 5 percent) of the optical power of the optical signal created by the at least one laser is tapped off and supplied to the filter input port.

Further, the optical transmitter or receiver may comprise a control device configured to receive electrical output signals of the two optical receiving elements and to create a control signal, depending on at least one of the electrical output signals, for controlling the at least one tunable laser with respect to the center wavelength thereof.

BRIEF DESCRIPTION OF THE DRAWINGS

Further objects and advantages of the present invention will become apparent from the following description of the preferred embodiments that are given by way of example with reference to the accompanying drawings, wherein.

DETAILED DESCRIPTION OF THE INVENTION

Figure 1:
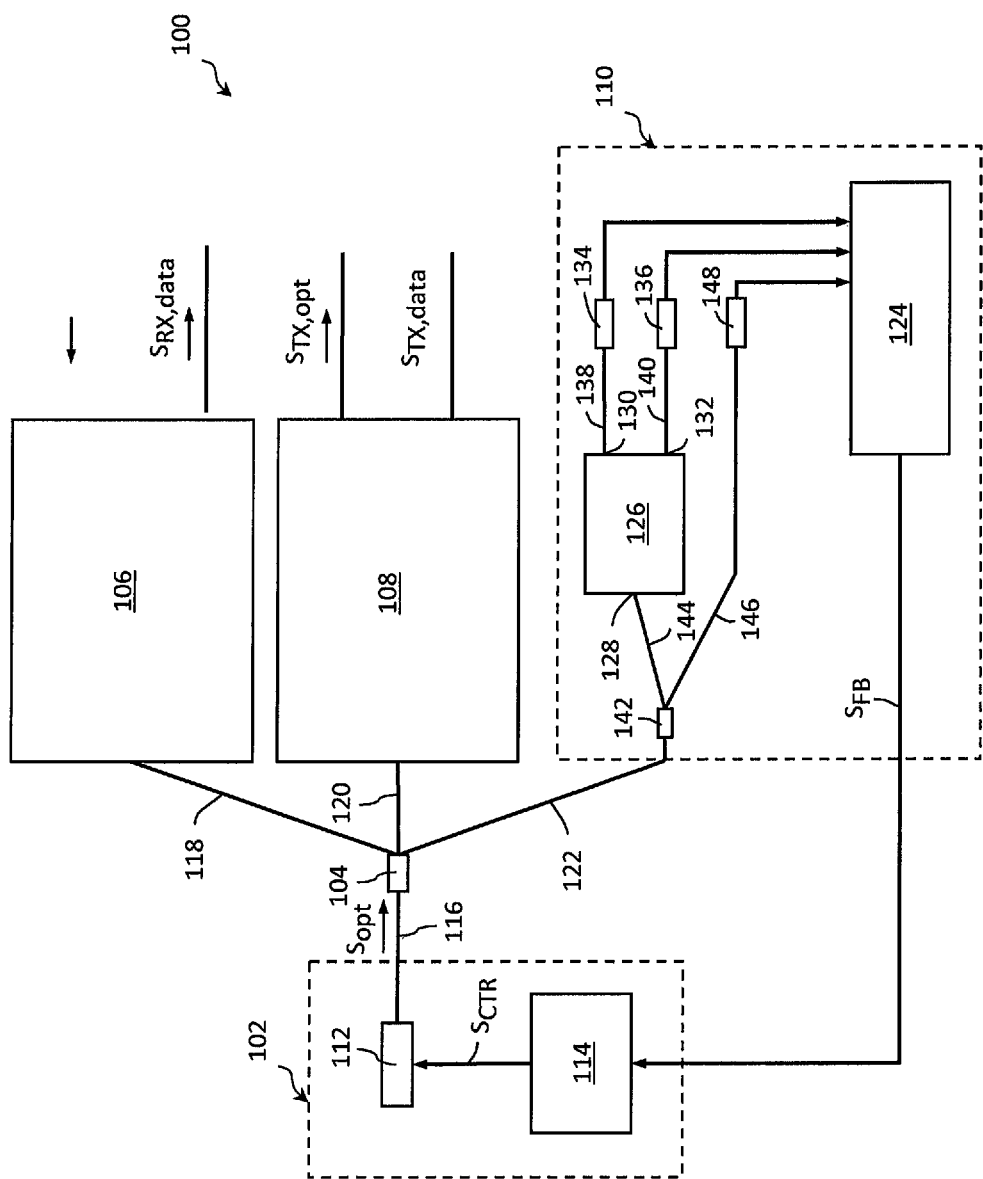
FIG. 1 shows a schematic block diagram of an optical (heterodyne) transceiver including an optical wavelength locking device comprising an optical interference filter device according to the present invention.

FIG. 1 shows a schematic block diagram of an optical heterodyne transceiver 100 comprising a narrow-band optical source 102, an optical 1×3 splitter 104, an optical heterodyne receiver 106, an optical modulator 108 and an optical wavelength locking device 110.

The optical source 102 may comprise a continuous wave (CW) optical emitter 112, e.g. a narrow-band semiconductor laser, and a controller device 114 configured to control the center wavelength of the optical radiation created by the optical emitter 112. Of course, a tunable narrow-band semiconductor laser may be used as the optical emitter 112, which is tunable over the full bandwidth of an optical WDM transmission system. Alternatively, the tuning bandwidth of the optical emitter 112 may be restricted to a bandwidth which comprises a predefined channel bandwidth of a respective optical transmission system.

A common port of the optical 1×3 splitter 104 is connected to an output port of the optical emitter 112 via an optical path 116. A first splitting port of the optical 1×3 splitter 104 is connected to an input port of the optical receiver 106 via an optical path 118, a second splitting port is connected to an input port of the optical modulator 108 via an optical path 120 and a third splitting port is connected to an input port of the optical wavelength locking device 110 via an optical path 122.

Preferably, the optical 1×3 splitter 104 is an asymmetric splitter supplying a major portion of the optical radiation received at its common port to the second splitting port, which is connected to the optical modulator 108. A first minor portion, e.g. a few percent thereof, is supplied to the first and second splitting ports. A second minor portion, which, however, may be larger than the first minor portion but smaller than the major portion, is supplied to the first splitting port, as the functionality of a heterodyne receiver usually requires a reference signal having a sufficient optical power.

The optical receiver 106 uses the optical CW radiation for carrying out a heterodyne detection of an optical receive signal $S_{RX,opt}$, which is supplied to an optical input port of the optical receiver 106. An electrical (or, as the case may be, optical) data receive signal $S_{RX,data}$ is output at an output port of the optical receiver 106 for further processing.

The optical modulator 108 creates an optical transmit signal $S_{TX,opt}$ by optically modulating the optical CW radiation, that is, an optical CW signal, supplied to its input port according to an electrical (or, as the case may be, optical) data transmit signal $S_{TX,data}$.

Of course, the optical modulator 108 may be configured to create an optical transmit signal $S_{TX,opt}$, which is modulated in two orthogonal polarization directions, wherein each polarization direction is modulated using an arbitrary QAM modulation. The optical receiver 106 may be configured to detect an optical receive signal $S_{RX,opt}$, which is modulated in such a complex manner.

It shall be noted at this point that, as the invention relates to a specific optical interference filter device, the invention is not restricted to specific optical transceiver devices. Rather, the invention may be used in connection with any type of transmitter or transceiver device or even with any type of integrated or stand-alone wavelength locking device. However, as the interference filter device described below may easily be realized in integrated optics, it may be integrated in single-wavelength (i.e. single channel) transceiver devices due to rather low manufacturing costs.

The optical wavelength locking device 102 at least comprises an evaluation device 124, an optical interference filter device 126, having an input port 128 and a first and a second filter output port 130, 132, and a first and a second optical detector 134, 136, which are connected to the first and the second filter output ports 130, 132, respectively, by means of a respective optical path 138, 140.

The embodiment shown in FIG. 1 further comprises an optical 1×2 splitter 142, an input port of which is connected to (or defines) the input port of the optical wavelength locking device 102. A first splitting port of the optical 1×2 splitter 142 is connected via an optical path 144 to an input port of the optical interference device 126 and a second splitting port is connected via an optical path 146 to a third optical detector 148.

The first, second and third optical detectors 134, 136, 148 may be realized or may comprise photodiodes for detecting the optical signals supplied thereto. Electrical signals (shown by the arrows in FIG. 1) created by the first, second and third optical detectors 134, 136, 148 are supplied to the evaluation device 124.

The evaluation device 124 is configured to evaluate the electrical signal values and to create a feedback signal $S_{FB}$ that is supplied to the controller device 114. The feedback signal $S_{FB}$ contains information regarding the absolute value of the center wavelength of the optical signal created by the optical emitter 112 or a deviation of the center wavelength from a desired center wavelength, i.e. information concerning the absolute value of the deviation and/or the direction thereof.

The evaluation device 124 creates the desired information either from a ratio of the values of the electrical signal values of the first and second optical detectors 134, 136 or from a first ratio of the electrical signal values of the first and third optical detectors 134, 148 and a second ratio of the electrical signal values of the second and third optical detectors 136, 148. In order to create the feedback signal $S_{FB}$, the evaluation device 124 may compare the respective ratio calculated to known wavelength dependencies of the ratio.

In order to control the center wavelength of the optical emitter 112, the controller device 114 uses the feedback signal $S_{FB}$ to create at least one control signal $S_{CTR}$, which is supplied to the optical emitter 112. The controller device 114 may control the optical emitter in such a way that the control signal sets the center wavelength to a predetermined value. That is, in this alternative, the controller device 114 knows the dependency of the center wavelength in relation to the control signal. Especially, this control method may be used when the transceiver has to be newly integrated into a WDM transmission system. Once the center wavelength has been set to a (sufficiently precise) initial value, the control device 114 may, continuously or in predetermined time intervals or on request, control the center wavelength using a closed loop control using the feedback signal $S_{FB}$.

However, as the evaluation of the electrical signals created by the optical detectors 126, 128, 140 does not form the core of the present invention, reference is made, in this respect, to the applicant's prior European patent application EP 2 573 961 A1, the full disclosure of which is hereby incorporated by reference.

Figure 2:
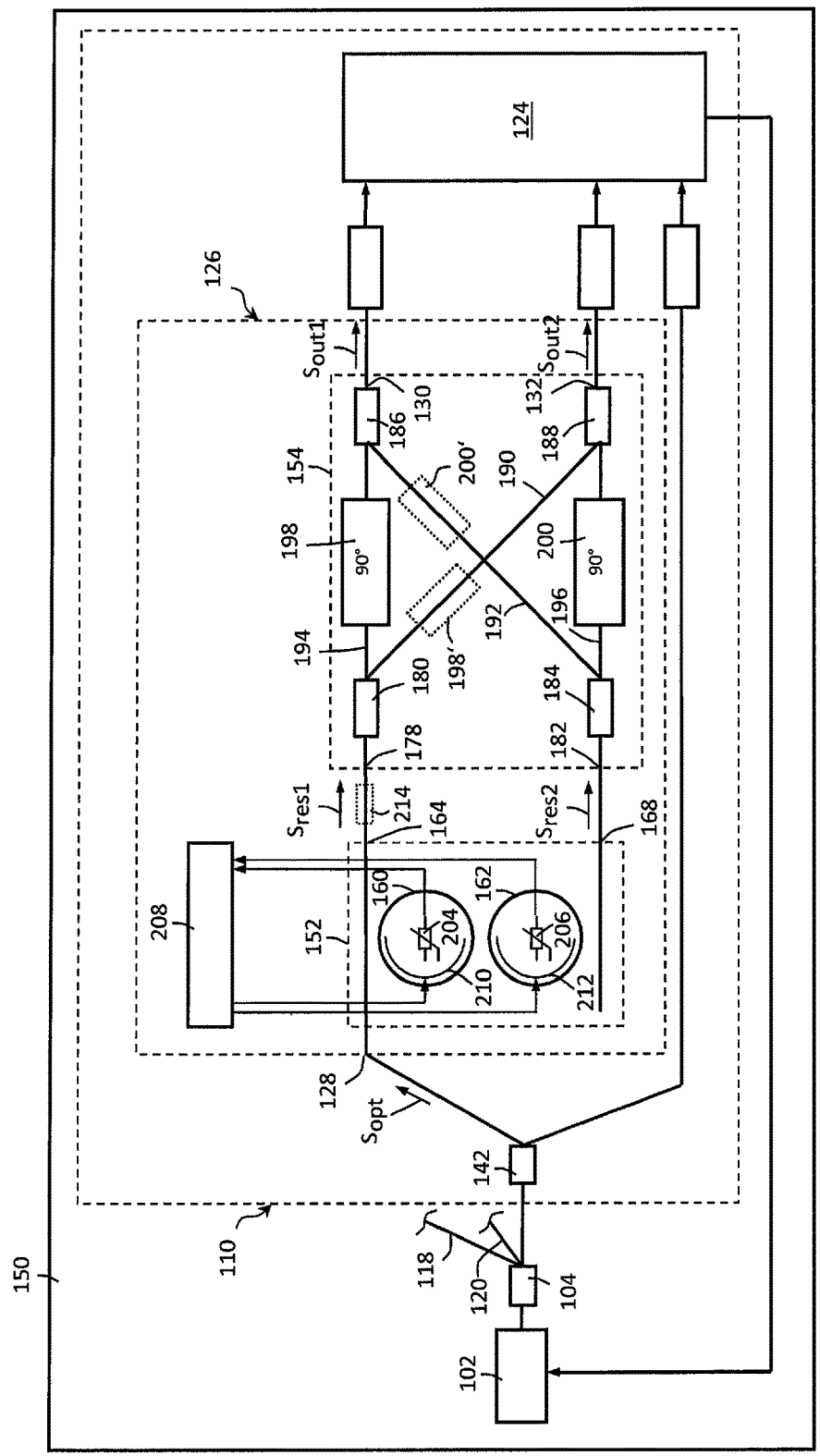
FIG. 2 shows a more detailed schematic block diagram of the wavelength locking device in FIG. 1 integrated on a substrate, which comprises an optical interference filter device consisting of an optical ring resonator structure and an optical combining and phase shifting structure connected thereto.

FIG. 2 shows a more detailed schematic block diagram of the wavelength locking device 110 according to FIG. 1. The wavelength locking device 110 is provided on a substrate 150, which also serves as a support for the optical source 102. The substrate 150 may be a printed circuit board of any manner or any type of silicon substrate. If the substrate 150 is realized as a silicon substrate, for example as a silicon on insulator (SOI) substrate, optical paths in the form of optical waveguides may be directly provided on the substrate. The substrate 150 may also be configured to serve as a support for modules, which may be separately manufactured and mounted in a suitable manner on the substrate 150.

For example, at least the optical components of the optical interference filter device 126, the optical 1×2 splitter 142 and the optical paths 128 and 146 may be directly manufactured on the substrate 150. These components may be realized in integrated optics using an SOI substrate as a basis. Other components, especially the optical detectors 134, 136, 148, the optical source 102 (or at least the optical emitter 112), and the evaluation device 124 may be mounted onto the substrate 150. However, the optical source may also be realized as an separate (external) component and coupled to the components provided on the substrate by an optical fiber.

In order to simplify the representation in FIG. 2, the optical receiver 106 and the optical modulator 108 have been omitted and the optical paths 118, 120 connecting the respective splitting ports of the optical 1×3 splitter 104 are only partially shown. Of course, the optical receiver 106 and the optical modulator 108 may also be provided on the substrate 150, either in the form of separate modules or (at least appropriate parts thereof) in integrated form.

It shall be mentioned at this point that the splitting of the optical power or the optical signal created by the optical source 102 may be effected in any way, for example by means of a single optical 1×4 splitter instead of the combination of the 1×3 splitter 104 and the additional 1×2 splitter 142, provided that the single optical splitter reveals the desired splitting ratios in the four branches.

As apparent from FIG. 2, the optical interference filter device 126 comprises an optical ring resonator structure 152 and an optical combining and phase shifting structure 154.

The input port of the ring resonator structure 152 defines the filter input port 128. The ring resonator structure 152 comprises a first optical port waveguide 156, a second optical port waveguide 158 and a first and a second ring-shaped optical waveguide 160, 162. The optical port waveguides 156, 158 are shown as straight waveguides but may assume, of course, any arbitrary shape suitable to guide the optical signals without inacceptable attenuation. The first optical port waveguide 156 defines (or is connected to) the filter input port 128 at one end thereof and a first resonator output port 164 at the other end. The second optical port waveguide 158 has an open end 166 and defines a second resonator output port 168 at the other end thereof.

The first and second optical port waveguides 156, 158 and the first and second ring-shaped optical waveguides 160, 162 are configured in such a way that they form a first, a second and a third coupling region 170, 172 and 174. The first coupling region 170 connects the first optical port waveguide 156 and the first ring-shaped optical waveguide 160, the second coupling region 172 connects the second optical port waveguide 158 and the second ring-shaped optical waveguide 162, and the third coupling region 174 connects the first and second optical port waveguide 156, 158. As shown in FIG. 2, the coupling regions 170, 172 and 174 may be realized by using evanescent coupling, i.e. the waveguides reveal coupling sections that are positioned so close that evanescent field portions of an optical waveguide in one of the coupling sections overlap with the cross-section of the coupling sections of the neighboring waveguide. However, the coupling regions may also be realized by multi-interference coupling (MMI), i.e. respective optical MMI couplers are used to optically couple the respective two waveguides.

As the design and function of such ring resonator structures comprising two optical port waveguides and two coupled ring-shaped optical waveguides is well known to an expert (that structures are used as optical add/drop-multiplexers), a detailed further description can be omitted.

However, the general design and function of the optical ring resonator structure 152 shown in FIG. 2 (and schematically shown in FIG. 3 in greater detail) will now be explained with reference to FIGS. 4a and 4b, which show the frequency responses of the optical ring resonator structure 152 measured at the first resonator port 164 (FIG. 4a) and the second resonator port 168 (FIG. 4b) with respect to the filter input port 128 (i.e. the resonator input port). In the embodiment shown in FIGS. 4a-5b, the curves for the frequency responses are shown for specific values of the optical length of the ring-shaped optical waveguides and specific values for the coupling factors, which define the coupling of the two ring-shaped optical waveguides.

Figure 3:
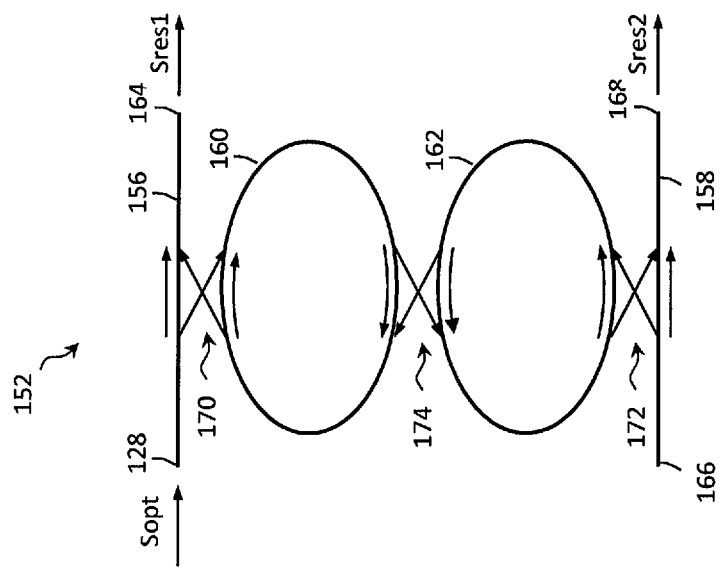
FIG. 3 shows a schematic representation of the optical ring resonator structure in FIG. 2.

As shown in FIG. 3, the optical signal created by the optical source 102 is supplied to filter input port 128. This optical signal is designated as filter input signal $S_{opt}$. As mentioned above, in case of the optical heterodyne receiver 100 shown in FIG. 1, the optical signal $S_{opt}$ may be a CW signal. However, as the present invention is applicable in connection with any arbitrary type of optical transceiver or optical transmitter, the optical signal $S_{opt}$ may also be a modulated optical signal representing a single optical channel or even an optical WDM signal comprising a plurality of optical channels.

In each of the coupling regions 170, 172, 174 a predetermined portion of the optical power of the incoming optical signal is coupled to the respective neighboring optical waveguide and the remaining portion of the optical power is transmitted through the respective coupling region 170, 172, 174. Of course, the optical coupling is effected in both directions, i.e. from a first one of the respective pair of optically coupled waveguides to a second one thereof and vice versa. The amount of optical power that is coupled to the respective other waveguide is determined by a predetermined coupling factor.

Figure 4A:
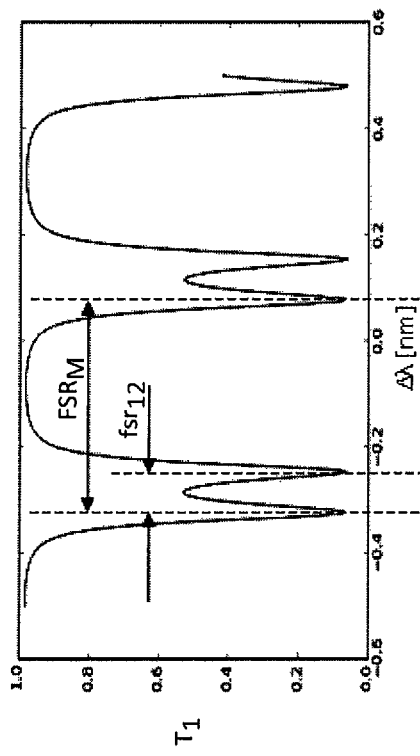
FIGS. 4a and 4b show two diagrams illustrating the frequency response between a first output port and an input port (FIG. 4a) of the optical ring resonator structure and the complementary frequency response between a second output port and the input port of the optical ring resonator structure (FIG. 4b)

FIG. 4a shows the magnitude of the frequency response of the optical ring resonator structure 152 between the first resonator output port 164 and the filter input port 128 of the optical ring resonator structure 152, i.e. the transmissivity $T_1$ with respect to these ports. The wavelength of the spectral representation in FIG. 4a is given in the form of a wavelength deviation $\Delta\lambda$ in nanometers with respect to a "center" wavelength $\lambda_0$ (e.g. $\lambda_0$=1550 nm). As apparent from the representation in FIG. 4a, the curve for the transmissivity $T_1$ is a periodic function having a free spectral range $FSR_M$. The free spectral range FSR mainly depends on the length of the optical path of the ring-shaped optical waveguides 160, 162, i.e. especially on the geometrical length thereof.

Figure 4B:
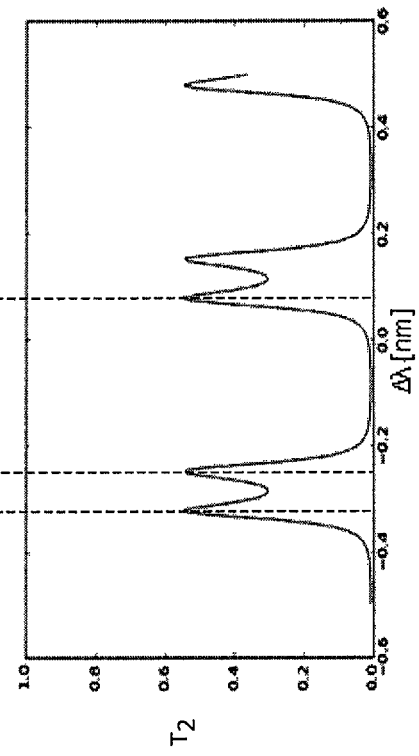

FIG. 4b shows the magnitude of the frequency response of the optical ring resonator structure 152 between the second resonator output port 168 and the filter input port 128, i.e. the transmissivity $T_2$ with respect to these ports. As apparent from this representation, the transmissivity curves $T_1$ and $T_2$ are complementary to each other.

Each of the transmissivity curves shown in FIGS. 4a and 4b reveal a periodic behavior, wherein each of the periodic peaks has a central dip, so that two separate peaks having an optical frequency distance $fsr_{12}$ form each of the peaks that are separated by the free spectral range $FSR_M$. The optical frequency distance $fsr_{12}$ between the two separate peaks forming a respective "main peak" is mainly influenced by the coupling factors of the third coupling region 174 between the two ring-shaped optical waveguides 160, 162. The curves shown in FIGS. 4a and 4b can thus be explained as curves that are created by superimposing two curves of (fictive) partial frequency responses that are shifted versus each other by the optical frequency distance $fsr_{12}$.

It shall be noted that the ring-shaped optical waveguides 160, 162 may, of course, have a circular shape as shown in FIG. 2, an oval shape as shown in FIG. 3 or any other shape. The optical port waveguides 156, 158 are shown as straight waveguides in the drawing but may reveal any arbitrary form that is suitable in order to form a coupling region. However, the use of straight or only slightly curved coupling sections of the waveguides, i.e. the sections of the waveguides that effect or influence the optical coupling, to be coupled is advantageous as such a design is more robust with respect to manufacturing tolerances.

Figure 6:
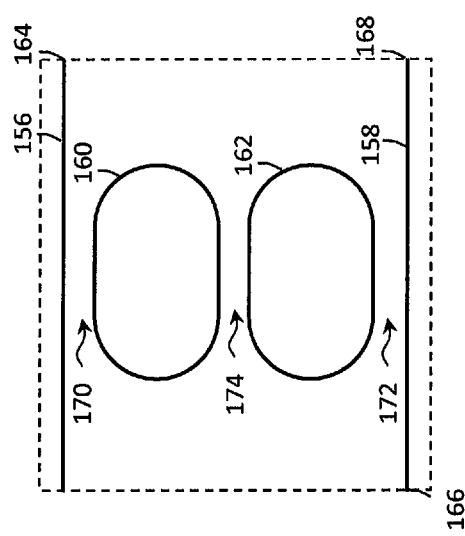
FIG. 6 shows a schematic representation of an embodiment of an optical ring resonator structure, wherein the coupling sections of the optical port waveguides and the ring-shaped optical waveguides reveal an essentially straight shape.

Such an embodiment of an optical resonator structure is shown in FIG. 6. Here, two straight optical port waveguides 156, 158 (i.e. respective straight coupling sections thereof) are coupled to the ring-shaped optical waveguides 160, 162. The ring-shaped optical waveguides comprise, in addition to the straight coupling sections, a further straight optical section that is formed parallel to the respective straight coupling section. Further, the ring-shaped optical waveguides comprise two essentially semi-circular portions, each of which connect two respective ends of the straight coupling sections so as to form a closed optical path.

As apparent from FIG. 2, the resonator output ports 164, 168 are connected to respective input ports of the optical combining and phase shifting structure 154. A first input port 178 of the optical combining and phase shifting structure 154 is connected to a common port of an optical 1×2 splitter 180 and a second input port 182 is connected to a common port of an optical 1×2 splitter 184. A first optical output port of the optical combining and phase shifting structure 154 forms the first filter output port 130 and is connected to a common port of a further optical 1×2 splitter 186. A second optical output port of the optical combining and phase shifting structure 154 forms the second filter output port 132 and is connected to a common port of another optical 1×2 splitter 188. Each of the two splitting ports of the optical 1×2 splitters 180, 184 is connected to a splitting port of the optical 1×2 splitters 186, 188. In this way, two crossing optical paths 190, 192 and two pass-through optical paths 194, 196 are created.

Within each of the pass-through optical paths 194, 196 an optical phase shifter 198, 200 is provided, which shifts the phase of the respective optical signal by 90°. In this way, the optical signal $S_{res1}$ output at the first resonator output port 164 and the optical signal $S_{res2}$ output at the second resonator output port 168 (designated as resonator output signals in the following description) are combined to form a first and second optical filter output signal $S_{out1}$, $S_{out2}$, respectively according to the following relations:

$$S_{out1}=1/\sqrt{2} \cdot j \cdot S_{res1}+1/\sqrt{2} \cdot S_{res2} \qquad (1)$$

$$S_{out2}=1/\sqrt{2} \cdot S_{res1}+1/\sqrt{2} \cdot j \cdot S_{res2} \qquad (2)$$

wherein the signals are complex entities and $j=e^{j90°}$ (and $j^2=-1$). The phase shift between the signals $S_{res1}$ and $S_{res2}$ may also be effected by using any other values (instead of 90°) in the crossover paths 192, 196 and the pass-through paths 194, 196 as long as the phase difference equals +90° (i.e. $S_{res1}$ is phase shifted by +90° versus $S_{res2}$ in order to create the signal $S_{out1}$ and $S_{res2}$ is phase shifted by +90° versus $S_{res2}$ in order to create the signal $S_{out2}$). For example, the phase shifter 198 may shift the signal $S_{res1}$ by 135° and the phase shifter 200 may shift the signal $S_{res2}$ by 180°, if an additional 45° phase shifter (not shown) is provided in the crossover path 192 and another additional 90° phase shifter (not shown) is provided in the crossover path 190. If a phase shifter realizing a negative phase shift could be realized, the above equations (1) and (2) could also be written as $$S_{out1}=1/\sqrt{2} \cdot S_{res1}-1/\sqrt{2} \cdot j \cdot S_{res2} \qquad (1')$$

$$S_{out2}=1/\sqrt{2} \cdot j \cdot S_{res1}-1/\sqrt{2} \cdot j \cdot S_{res2} \qquad (2')$$

Of course, in order to avoid negative phase shifts, the imaginary unit $-j$ may be created by a phase shift of 270° as $e^{-j90°}=e^{+j270°}=-j$.

A similar effect can be obtained by providing phase shifters 198', 200' (shown with dotted lines in FIG. 2) in the cross-over paths 190, 192 instead of the phase shifters 198, 200 in the pass-through paths 194, 196. In this configuration, the filter output signals $S_{out1}$, $S_{out2}$ can be obtained by the following equations:

$$S_{out1}=1/\sqrt{2} \cdot S_{res1}+j \cdot 1/\sqrt{2} \cdot S_{res2} \qquad (3)$$

$$S_{out2}=1/\sqrt{2} \cdot j \cdot S_{res1}+1/\sqrt{2} \cdot S_{res2} \qquad (4)$$

Also in this case, these equations can be rewritten as $$S_{out1}=1/\sqrt{2} \cdot j \cdot S_{res1}+1/\sqrt{2} \cdot S_{res2} \qquad (3')$$

$$S_{out2}=1/\sqrt{2} \cdot S_{res1}-1/\sqrt{2} \cdot j \cdot S_{res2} \qquad (4')$$

Equations (3) and (4) differ from equations (1) and (2) (and equations (3') and (4') differ from equations (1') and (2')) only in that the terms for calculating the signals $S_{out1}$, $S_{out2}$ have been interchanged, i.e. the signals created at first and second filter output ports 130, 132 are interchanged.

However, this fact can be taken into account when using the respective optical interference filter device 126 in a specific application.

It would also be possible to provide phase shifters within the cross-over paths 190, 192 as well as in the pass-through paths 194, 196. In this generalized embodiment, the signals $S_{out1}$, $S_{out2}$ are created according to the generalized equations $$S_{out1}=1/\sqrt{2}\cdot e^{j\phi1}\cdot S_{res1}+1/\sqrt{2}\cdot e^{j\phi2}\cdot S_{res2} \qquad (5)$$

$$S_{out2}=1/\sqrt{2}\cdot e^{j\phi3}\cdot S_{res1}+1/\sqrt{2}\cdot e^{j\phi4}\cdot S_{res2} \qquad (6)$$

wherein $\phi1$ is the phase shift caused by the phase shifter 198 in the first pass-through path 194, $\phi2$ is the phase shift caused by the phase shifter 200' in the second crossover path 192, $\phi3$ is the phase shift caused by the phase shifter 200 in the second pass-through path 196 and $\phi4$ is the phase shift caused by the phase shifter 198' in the first crossover path 190, and wherein the phase shifts $\phi1$, $\phi2$, $\phi3$, $\phi4$ are determined such that the phase differences $\Delta\phi1=\phi2-\phi1$ and $\Delta\phi2=\phi4-\phi3$ assume the values $\Delta\phi1=+90°$ and $\Delta\phi2=-90°$ or $\Delta\phi1=-90°$ and $\Delta\phi2=+90°$.

The effect of the optical combining and phase shifting structure 154 having the above-explained properties will now be explained with reference to FIGS. 5a and 5b that visualizes the above equations (1) and (1') (FIG. 5a) and (2) and (2') (FIG. 5b), respectively. However, for reasons of simplicity, the factor $1/\sqrt{2}$ has been omitted.

Figure 5A:
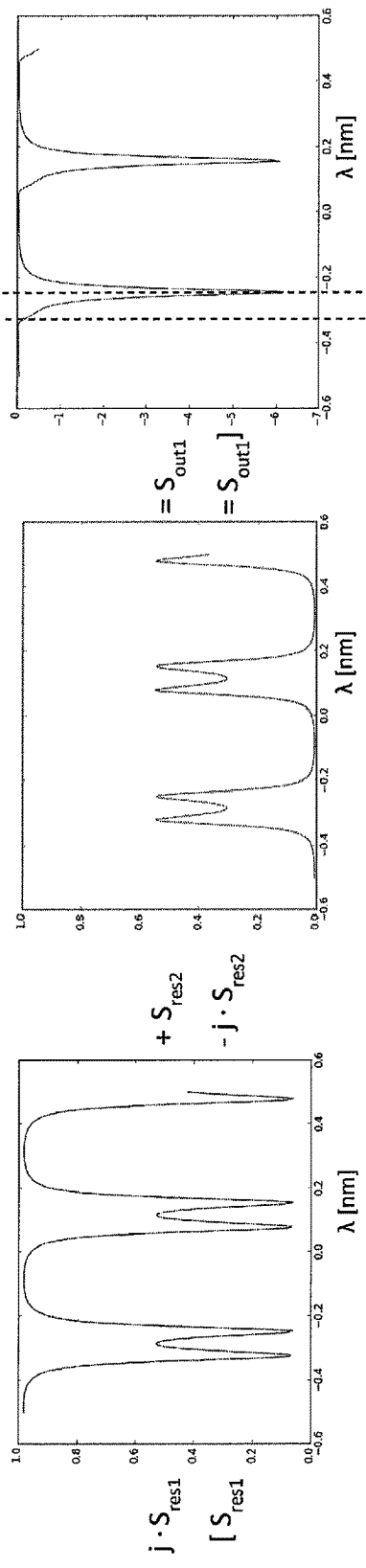
FIGS. 5a and 5b show a picturized explanation of the formation of the frequency responses between a first filter output port and a filter input port (FIG. 5a) and a second filter output port and the filter input port (FIG. 5b) of the optical interference filter device.
Figure 5B:
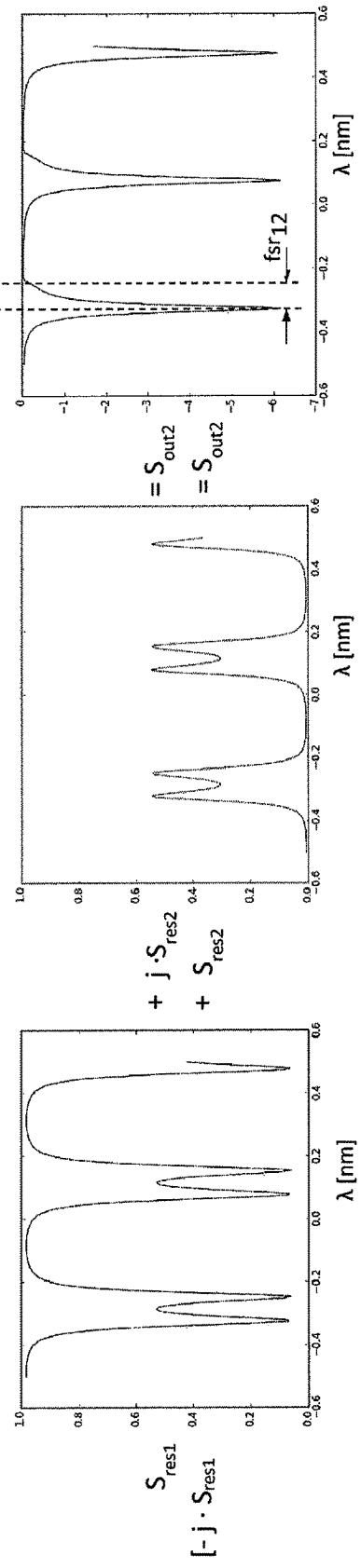

As apparent from FIGS. 5a and 5b, multiplexing the signals $S_{res1}$ and $S_{res2}$ output at the resonator output ports 164, 168 using the optical combining and phase shifting structure 154 leads to combined frequency responses, i.e. to frequency responses of the whole optical interference filter device 126, at the first and second filter output ports 130, 132 with respect to the filter input port 128. The frequency responses of the optical interference filter device (shown on the right-hand side of FIGS. 5a and 5b) have the same FSR as the frequency responses of the optical ring resonator structure 152 at the resonator output ports 164, 168 (the FSR having the value $FSR_M$). However, the frequency responses of the optical interference filter device 126 merely comprises a single, relatively sharp peak, wherein the frequency response at the first filter output port 130 is shifted by the optical frequency distance $fsr_{12}$ between the two peaks neighboring the central dip of the periodic minima/maxima of the complementary transfer functions at the first and second resonator output ports 164, 168 (these transfer functions are shown on the left-hand side and in the middle of FIGS. 5a and 5b).

Thus, the frequency responses of the optical interference filter device 126 reveals, between two neighboring minima, a single first section having a positive slope and a single second section having a negative slope, only. As explained above, this property facilitates the use of such an optical interference filter device in an optical wavelength locking device. The phase shift corresponding to the frequency difference $fsr_{12}$ makes it possible to provide a sufficiently steep slope within a major portion of the FSR by selecting the frequency response that reveals the steeper slope at the respective wavelength or optical frequency or using the ratio of the frequency responses at the first and second filter output port in order to create a new dependency that allows to provide an absolute optical frequency or wavelength value for a given value of the respective frequency response or a given value of the ratio of the two frequency responses as explained in EP 2 573 961 A1.

As explained above, the frequency distance $fsr_{12}$ between the frequency responses at the first and second filter output port is determined by the coupling factors between the first and second ring-shaped optical waveguides 160, 162. Thus, by choosing an appropriate design of the coupling region 174, i.e. determining the cross-section and the length of the coupling sections of the ring-shaped optical waveguides and their materials, the frequency distance $fsr_{12}$ can be set to a desired value.

The coupling factors that determine the coupling between the coupling sections of the optical port waveguides 156, 158 and the respective ring-shaped optical waveguides 160, 162 determine the extinction ratio of the frequency responses of the optical resonator structure 152 shown in FIG. 4a, 4b (and also on the right-hand side and in the middle of FIGS. 5a and 5b).

Figure 7:
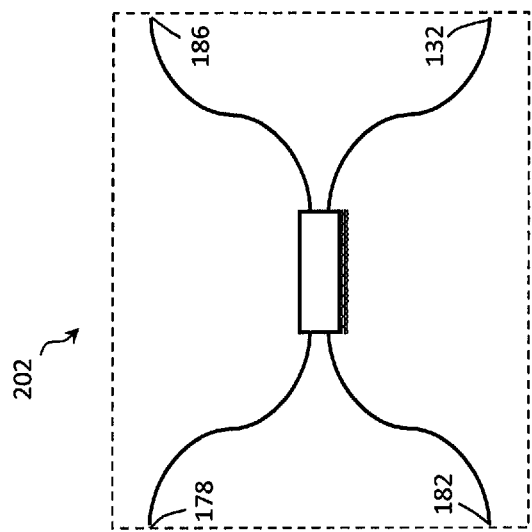
FIG. 7 shows a schematic representation of an alternative embodiment of the optical combining and phase shifting structure in the form of an optical 2×2 MMI coupler.

FIG. 7 shows a further embodiment of an optical combining and phase shifting structure 154 in the form of an optical 2×2 coupler 202 that is realized as an MMI coupler. Each of the two input splitting ports of the 2×2 coupler 202 forms an input port of the optical combining and phase shifting structure 154 and each of the two output splitting ports of the 2×2 coupler 202 forms a filter output port 130, 132. Such an MMI coupler is a rather simple optical component and can easily be designed having the multiplexing properties explained above.

It shall be mentioned at this point that the multiplexing of the resonator output signals $S_{res1}$ and $S_{res2}$ requires the superposition of essentially equal power portions of the respective signals. Thus, preferably 50% optical 1×2 splitters are used in the embodiment according to FIG. 2. If an optical 2×2 MMI splitter is used in order to realize the optical combining and phase shifting structure 154, the 2×2 splitter shall be designed accordingly.

As the coupling factors which determine the optical coupling properties in the first, second and third coupling regions 170, 172, 174 and also the optical length of the ring-shaped optical waveguides 160, 162 depend on the materials of the optical waveguides and the material properties depend on the temperature to a large extent, it is decisive to keep the temperature constant at a predetermined value $T_0$. For this purpose, the embodiment shown in FIG. 2 comprises a first and a second temperature sensor 204, 206 which are configured to detect the temperature of the ring-shaped optical waveguide 160 and the ring-shaped optical waveguide 162. Each of the temperature sensors 204, 206 is connected to a control unit 208. The temperature sensors may be realized in any appropriate way, e.g. as NTC resistors or the like.

The control unit 208 receives temperature signals created by the temperature sensors 204, 206 and uses these signals to create respective control signals, which are supplied to heating devices 210, 212, wherein the heating device 210 is provided in such a way that it supplies thermal energy essentially to (the area of the) the ring-shaped optical waveguide 160 and wherein the heating device 212 is provided in such a way that it supplies thermal energy essentially to (the area of the) the ring-shaped optical waveguide 162 and also to the coupling regions 170, 172, 174.

In order to avoid that the environmental temperature is higher than the predetermined temperature of the regions and thus to avoid a cooling function of the heating devices 210, 212, the predetermined temperature $T_0$ is chosen in such a way that it supersedes any environmental temperature possible under usual (or admissible) operating conditions. Preferably, the predetermined temperature value $T_0$ is determined as an upper value of a predefined operating range of the optical interference filter device 126 or any apparatus comprising the optical interference filter device 126 like the optical wavelength locking device 110 or the optical heterodyne transceiver 100. For example, if the operating temperature range is defined as 0° C. to 85° C., the predefined temperature $T_0$ can be set to 85° C.

Of course, instead of two temperature sensors 204, 206 any number of sensors may be provided that is suitable to deliver information concerning the temperature of the critical portions of the optical resonator structure 152. Also, any number of heating devices 210, 212 may be provided that is appropriate to deliver thermal energy in such a way that the temperature of the critical portions of the optical resonator structure 152 is kept at the desired temperature $T_0$.

As shown in FIG. 2, an additional optical phase shifter may be provided between the first resonator output port 164 and the first input port 178 of the optical combining and phase shifting structure 154. This optical phase shifter 214 may be required to shift the phase of the resonator output signal $S_{res1}$ versus the resonator output signal $S_{res2}$ in order to compensate a phase shift of these signals (or a respective phase difference of the frequency responses between the respective first or second resonator output port 164, 168 and the filter input port 128. Such a phase shift may be caused by the optical coupling (or the complex coupling coefficients) between the two ring-shaped optical waveguides 160, 162. The phase shifter may, of course also be provided between the second resonator output port 164 and the second input port 178 of the optical combining and phase shifting structure 154. The required phase shift may be within the range of ±90 degrees.

LIST OF REFERENCE SIGNS 100 optical heterodyne transceiver
102 optical source
104 optical 1×3 splitter
106 optical heterodyne receiver
108 optical modulator
110 optical wavelength locking device
112 optical emitter
114 controller device
116 optical path
118 optical path
120 optical path
122 optical path
124 evaluation device
126 optical interference filter device
128 filter input port
130 (first) filter output port
132 (second) filter output port
134 (first) optical detector
136 (second) optical detector
138 optical path
140 optical path
142 optical 1×2 splitter
144 optical path
146 optical path
148 (third) optical detector
150 substrate
152 optical ring resonator structure
154 optical combining and phase shifting structure
156 first optical port waveguide
158 second optical port waveguide
160 first ring-shaped optical waveguide
162 second ring-shaped optical waveguide
164 first resonator output port
166 open end (of 158)
168 second resonator output port
170 first coupling region
172 second coupling region
174 third coupling region
178 first input port
180 optical 1×2 splitter
182 second input port
184 optical 1×2 splitter
186 optical 1×2 splitter
188 optical 1×2 splitter
190 crossover path
192 crossover path
194 pass-through optical path
196 pass-through optical path
198 optical phase shifter
198' optical phase shifter
200 optical phase shifter
200' optical phase shifter
202 optical 2×2 MMI coupler
204 temperature sensor
206 temperature sensor
208 control unit
210 heating device
212 heating device
214 optical phase shifter
$S_{opt}$ filter input signal
$S_{CTR}$ control signal
$S_{RX,opt}$ optical receive signal
$S_{TX,opt}$ optical transmit signal
$S_{RX,data}$ data receive signal
$S_{TX,data}$ data transmit signal
$S_{res1}$ resonator output signal
$S_{res2}$ resonator output signal
$S_{out1}$ filter output signal
$S_{out2}$ filter output signal
$T_0$ predefined temperature
$FSR_M$ free spectral range of the optical resonator structure
$fsr_{12}$ frequency shift

The invention claimed is:

1. An optical interference filter device, especially for an optical wavelength locking device,
   (a) the optical interference filter device defining a first periodic filter frequency response between a first filter output port and a filter input port and a second periodic filter frequency response having a same free spectral range as the first periodic frequency response between a second filter output port and the filter input port, wherein the first and second periodic filter frequency responses are shifted versus each other by a predetermined optical frequency distance,
   wherein
   (b) the optical interference filter device comprises an optical ring resonator structure and an optical combining and phase shifting structure,
   (c) the optical ring resonator structure comprises two optically coupled ring-shaped optical waveguides, each of which is further coupled to a dedicated optical port waveguide, wherein one of the optical port waveguides defines the filter input port at a first end thereof and a first resonator output port at a second end thereof and wherein the other of the optical port waveguides has an open first end and defines a second resonator output port at a second end thereof,
   (d) the optical combining and phase shifting structure has a first and second input port and a first and second output port, the first input port being connected to the first resonator output port and the second input port being connected to the second resonator output port, the first and second output ports defining the first and second filter output ports, respectively, and (e) the optical combining and phase shifting structure comprises a first crossover path between the first input port and the second output port, a second crossover path between the second input port and the first output port, a first pass-through path between the first input port and the first output port and a second pass-through path between the second input port and the second output port, wherein in both pass-through paths and/or both crossover paths optical phase shifting means are provided which are configured to effect a phase shift difference of plus or minus 90 degrees between the optical signals that are guided in the first pass-through path and the second crossover path and a phase shift difference of minus or plus 90 degrees between the optical signals that are guided in the second pass-through path and the first crossover path.

2. The optical interference filter device according to claim 1, wherein the optical ring resonator structure is designed in such a way that it defines a periodic frequency response between the first resonator output port and the filter input port and a complementary periodic frequency response between the second resonator output port and the filter input port, the periodic frequency response comprising two superimposed partial periodic frequency responses, which are shifted versus each other by a predetermined optical frequency distance equal to the frequency shift between the first and second periodic filter frequency responses and which have a free spectral range equal to the free spectral range of the first and second periodic filter frequency responses.

3. The optical interference filter device according to claim 1, wherein the ring-shaped optical waveguides, especially a geometry, materials thereof, and coupling factors between the first and second ring-shaped optical waveguides are designed in such a way that the first and second partial periodic frequency responses are shifted versus each other by the predetermined optical frequency distance and have a free spectral range equal to the free spectral range of the first and second periodic filter frequency responses.

4. The optical interference filter device according to claim 1, wherein one or both of the optical port waveguides comprise an essentially straight coupling section, which is configured to effect the optical coupling with the respective ring-shaped optical waveguide.

5. The optical interference filter device according to claim 1, wherein one or both of the ring-shaped optical waveguides comprise a straight coupling section, which is configured to effect the optical coupling with the respective optical port waveguide.

6. The optical interference filter device according to claim 1, wherein one or both of the ring-shaped optical waveguides comprise a straight coupling section, which is configured to effect the optical coupling with the respective other ring-shaped waveguide.

7. The optical interference filter device according to claim 1, wherein the optical combining and phase shifting structure comprises, at each of the first and second input ports, an optical splitter for splitting the optical path into the respective pass-through and crossover paths, at each of the first and second output ports, an optical combiner for combining the respective pass-through and crossover paths, and, either within both pass-through paths and/or within both crossover paths, the optical phase shifting means.

8. The optical interference filter device according to claim 7, wherein the optical phase shifting means comprises optical 90 degree phase shifters.

9. The optical interference filter device according to claim 1, wherein the optical combining and phase shifting structure is realized as an optical 2×2 multimode interference coupler.

10. The optical interference filter device according to claim 1, wherein the optical coupling between the two ring-shaped optical waveguides and/or the optical coupling between the optical port waveguides and the respective ring-shaped optical waveguides is effected by evanescent coupling or by multimode interference coupling.

11. The optical interference filter device according to claim 1, wherein the optical interference filter device comprises a temperature control device for stabilizing a temperature of the ring resonator structure, especially a temperature of the two ring-shaped optical waveguides, at a predetermined temperature.

12. The optical interference filter device according to claim 11, wherein the temperature control device comprises at least one temperature sensor, which is configured to create a sensor signal depending on the temperature of the ring resonator structure, especially the temperature of the two ring-shaped optical waveguides, a cooling and/or heating device and a control unit, which is configured to receive the sensor signal of the at least one temperature sensor and to create a control signal, which is supplied to the cooling and/or heating device, in such a way that the at least one sensor signal is controlled to a predetermined value that corresponds to the predetermined temperature.

13. The optical interference filter device according to claim 11, wherein the temperature control device comprises a heating device, which is configured to stabilize the temperature at a value that is higher than any environmental temperature to be expected.

14. The optical interference filter device according to claim 13, wherein the value is at an upper limit of a given specification range for the environmental temperature.

15. The optical interference filter device according to claim 1, wherein the optical interference filter device is fabricated as an integrated optical device.

16. An optical transmitter or transceiver device comprising at least one tunable laser, wherein the at least one tunable laser and an optical interference filter device according to claim 1 are provided on a common substrate, wherein the at least one tunable laser and the optical interference filter device are provided on separate substrates, which are mounted on the common substrate, wherein the at least one tunable laser and the optical interference filter device are directly manufactured on the common substrate, or wherein the at least one tunable laser is directly manufactured on a substrate of the optical interference filter device.

17. The optical transmitter or transceiver device according to claim 16, wherein an output port of the at least one laser is directly or indirectly coupled to an input port of an optical splitter and that the filter input port of the optical interference filter device is coupled to an output port of the optical splitter.

* * * * *